Figure 1:
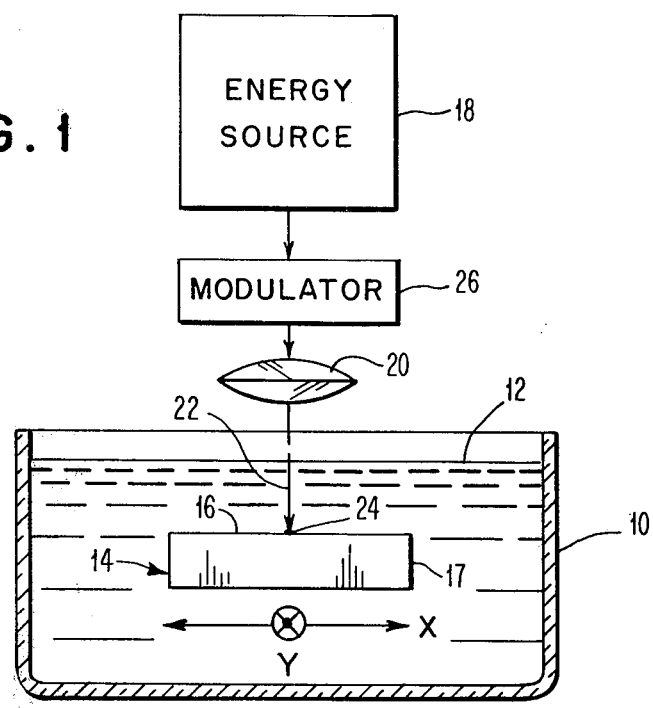

United States Patent [19]

Blum et al.

[11] 4,239,789
[45] Dec. 16, 1980

[54] MASKLESS METHOD FOR ELECTROLESS PLATING PATTERNS

[75] Inventors: Samuel E. Blum, White Plains; Zlata Kovac, Somers; Robert J. von Gutfeld, New York, all of N.Y.

[73] Assignee: International Business Machines Corporation, Armonk, N.Y.

[21] Appl. No.: 37,073

[22] Filed: May 8, 1979

[51] Int. Cl.³ .............................................. B05D 3/06
[52] U.S. Cl. .................... 427/53.1; 427/56.1; 427/304; 427/305; 427/306
[58] Field of Search ............................ 427/304–306, 427/53, 56.1, 53.1

[56] References Cited

U.S. PATENT DOCUMENTS

| 3,529,961 | 9/1970 | Schaefer et al. | 204/15 |
| 3,530,053 | 9/1970 | Scott et al. | 427/53 |
| 3,762,938 | 10/1973 | Ridenour et al. | 427/53 |
| 3,772,056 | 11/1973 | Polichette et al. | 427/53 |
| 3,772,078 | 11/1973 | Polichette et al. | 427/53 |
| 3,993,802 | 11/1976 | Polichette | 427/53 |
| 3,994,727 | 11/1976 | Polichette et al. | 427/53 |
| 4,072,768 | 2/1978 | Fraser et al. | 427/53 |
| 4,084,023 | 4/1978 | Dafter | 427/53 |
| 4,133,908 | 1/1979 | Madsen | 427/53 |
| 4,161,436 | 7/1979 | Gould | 204/157.1 R |

FOREIGN PATENT DOCUMENTS 50-92830 7/1975 Japan ........................................ 204/15

Primary Examiner—Ronald H. Smith
Assistant Examiner—Janyce A. Bell
Attorney, Agent, or Firm—Michael J. Weins

[57] ABSTRACT

A method for high resolution maskless electroless plating is described. Preferential plating results from exposing those regions where plating is sought to an energy beam to increase the plating rate by a factor of $10^3$ to $10^4$. This enhancement is sufficient to make masking unnecessary.

7 Claims, 2 Drawing Figures

MASKLESS METHOD FOR ELECTROLESS PLATING PATTERNS

DESCRIPTION

1. Technical Field

This invention relates generally to a method for enhancing the rate of electroless plating, more particularly to a technique which employs an energy beam to enhance the plating rate.

Copending applications 037,075 and 037,074 both of which were filed May 8, 1979, respectively treat methods for locally enhancing the rate of electroplating, and for locally enhancing the rate of chemical and electrochemical machining.

2. Background Art

While it is possible to produce high resolution patterns by electroless deposition techniques wherein masking is employed to delineate the patterns, these plating processes require multiple steps. It is necessary to employ a photoresist to mask the surface to selectively expose the photoresist mask, to plate the surface, and finally, to strip the mask. This process is a multistep process. Furthermore, the plating rate is not enhanced by this technique.

Scott et al in U.S. Pat. No. 3,530,053 teach exposing the plating solution to a high intensity light source to enhance the plating rate. While this technique increases the plating rate, it is not well suited for preferentially plating patterns since there will be mixing of the activated solution with the nonactivated solution. The mixing will reduce the resolution of any resulting pattern.

G. Suzuki and P. Tomoski in U.S. Pat. No. 3,935,117 teach a method for selectively etching patterns by employing a photosensitive compound which is applied to the surface to be etched. When dry, the compound is irradiated with ultraviolet radiation which activates the solution and produces etching. It should be noted that both the Scott et al and the Suzuki et al patents are limited with respect to the materials that may be employed, since the etch and compounds must be photosensitive. Furthermore, the Suzuki et al patent places a second restriction on the material; it must dry to form a layer coating the surface which may then be activated.

J. Polichette et al in U.S. Pat. No. 3,993,802 teach coating the surface to be plated with a sensitizing solution. The coated surface is exposed to light to form a catalytic layer capable of directly catalyzing the deposition of metal thereon from an electroless metal deposition solution. Again, this technique suffers from the limitation of being a multistep process and requires a light activated catalytic layer.

Disclosure of Invention

An object of the present invention is to establish a method for maskless electroless plating.

Another object of the invention is to provide a method for plating which is suitable for personalization of integrated circuits.

A further object of this invention is to provide a method for selectively varying the plating rate to allow local adjustments in the plating thickness and provide a more wear resistant surface.

Various other objects and advantages of the present invention will become apparent to those skilled in the art from the following description and suggested industrial applications.

The practice of the present invention allows one to electroless plate a pattern on a surface of a workpiece without masking. The surface to be plated is contacted with an electroless plating solution. An energy beam is directed onto the workpiece to locally heat the surface and promote enhanced plating.

Best Mode for Carrying Out the Invention

The practice of the energy beam assisted electroless plating will be described in terms of FIG. 1. There is shown in FIG. 1 a vessel 10 which contains an electroless plating solution 12. The workpiece 14 is immersed in the plating solution 12 so as to cause the surface 16, where plating is desired, to be contacted by the plating solution 12. The electroless plating solution 12 contains ions to be plated. These ions are usually either copper, nickel, or gold. The ions from the solution 12 will plate directly on a surface 16 if it is the same material.

Alternatively, when the surface 16 is a different material it may be activated by immersion in a solution such as palladium chloride or when surface 16 is a metal by applying an instantaneous voltage between the surface and an electrode placed in the solution 12 which is maintained anodic with respect to the surface 16.

While the workpiece 14 has been illustrated with the plated surface 16 being a horizontal flat surface, any surface contactable with the solution and subject to the beam's energy can be the plating surface. This would include the surfaces of holes, crevices, etc.

When the workpiece 14 is submerged in the solution 12 plating will occur at a nominal or background rate on all exposed faces including the surface 16. An energy source 18 is focused by a lens system 20 to concentrate the energy and form a beam 22 which passes through the plating solution 12 and impinges on the surface 16. An energy source 18 which generates electromagnetic radiation in the visible or infrared spectrum is particularly useful since a wavelength can be selected which is not strongly absorbed by the etching solution 12 but is strongly absorbed by the workpiece 14. When it is desired to plate high resolution patterns with front surface illumination, it is most efficiently achieved by having a workpiece 14 of very low thermal conductivity, i.e. a thermal insulator, thereby preventing thermal spread.

Figure 2:
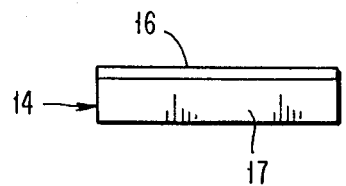

This technique of energy beam enhanced electroless plating is particularly well suited for a workpiece 14 which is a composite in which the plated surface 16 is a strongly optical absorbant film of a material such as a metal, and the substrate 17 is a material with a low thermal conductivity such as glass. This configuration of the workpiece 14 is illustrated in FIG. 2. This composite structure will further enhance the localization of the heat effected zone and thereby increase the preferential plating in the heated regions. The beam 22 exposes the region 24 locally heating that portion of the surface 16 where plating is sought. The region 24 exposed and heated by the beam 22 may be so manipulated by moving the workpiece 14 in the x and the y directions. Alternatively, it is possible to maintain the workpiece 14 stationary and manipulate the beam 22.

When electromagnetic radiation in the visible range is employed it can be generated from a carbon arc but preferably a laser is desired. The laser provides a high intensity energy source 18 which may eliminate the necessity of a lens system 20 unless further focusing is desired to reduce the size of the beam 22. The intensity of the light in all cases should be sufficient to provide a beam 22 with an intensity preferably between about $10^2$ to $10^6$ W/cm$^2$.

The lower limit is required to provide sufficient heating for enhancement of the plating rate, while the upper limit should be chosen to avoid thermotransformation of the structure of the workpiece 14. In general, this will limit the maximum power input to about $10^6$ W/cm$^2$.

When a beam 22 passes through the etching solution 12 care must be taken in selecting the wavelength of the light to avoid a frequency that is strongly absorbed by the etching solution 12. It should be pointed out that this teaches away from the method of Scott et al. Alternative plating arrangements are available where the beam 22 need not pass through the plating solution 12. If, for example, only the surface 16 of the workpiece 14 is brought in contact with the plating solution 12, the beam 22 may expose the workpiece 14 on the side opposite the plated surface 16. For best illumination, finite thermal conductivity is required to transport the heat to the front surface where plating is desired. For a point source illumination on the back, the resolution of the plated region on the front will be on the order of the thickness (e.g. the front to back dimension). Thus, for maximum resolution front surface point source illumination is preferred.

The same back illumination technique can be used for a thicker composite workpiece 14 as illustrated in FIG. 2. In this case it is desirable to have a strongly absorbing surface 16 which typically could be a metal and a substrate 17 which is transparent to the radiation.

The beam 22 emitted from the energy source 18 may be modulated by a modulator 26 which may be placed between the energy source 18 and the lens system 20, or alternatively between the lens system 20 and the workpiece 14. The modulator 26 may be a mechanical light chopper when the modulation rate is low or an optical modulator can be employed when more rapid modulation is sought. Optical modulation will allow frequencies up to gigahertz.

Preferential plating will occur in the region 24 heated by the impinging light. For a finite thermally conducting surface 16, modulating or pulsing of the light provides sharper temperature profiles in the vicinity of the light exposed region 24, enhances the plating rate, and improves edge definition.

Modulation of the laser light has the effect of limiting the thermal spread which occurs in the substrate through thermal conduction which leads to a decrease in the resolution.

While all modes of the present invention have been described in terms of a single beam 22 impinging on the workpiece 14 one could employ multiple beams and simultaneously plate at multiple locations.

EXAMPLE I

Nickel films approximately 100 Å thick are vapor deposited onto 12 mil glass substrates. The composite structures are used as workpieces. The nickel plated surfaces are contacted with an electroless plating solution of the following composition:

| | |
|---|---|
| 0.1 molar | NiSO$_4$ |
| 0.2 molar | NaH$_2$PO$_2$ |
| 1.0 molar | NH$_4$Cl |

NH$_4$OH in sufficient quantities to adjust the pH to between 8 and 9, and 1 gm of sodium per l of solution.

A continuous beam from an argon laser, tuned to 5145 Å, is passed through the solution and illuminates regions of the surface of the nickel films. The beam locally heats the regions to be plated. The beam's spot size is approximately 170 μm and has a power density of $1 \times 10^3$ W/cm$^2$.

The plating as a function of time of illumination for the samples is tabulated below:

| Time | Thickness | Average Diameter | Average Plating Rate (Å/sec) |
|---|---|---|---|
| 5 s | 2,500Å | ~160μm | 500 |
|  | 2,100Å |  | 420 |
|  | 2,400Å |  | 480 |
| 10 s | 8,000Å | 175μm | 800 |
|  | 7,500Å |  | 750 |
|  | 7,000Å |  | 700 |
| 15 s | 12,000Å | 170μm | 800 |
|  | 10,000Å |  | 670 |
|  | 9,000Å |  | 600 |
|  | 11,000Å |  | 730 |

EXAMPLE II

The workpieces are prepared and contacted with the solution as described in Example I. The laser beam, generated as described in Example I, is passed through the glass substrate and impinges on the glass-nickel interface of the workpieces causing local heating of the region of film where plating is sought. The localized plating rates on the free surfaces (i.e. the surfaces opposite the light exposed surfaces) which are in contact with the plating solution are tabulated below:

| Time | Thickness | Average Diameter | Average Plating Rate (Å/sec) |
|---|---|---|---|
| 5 s | 1,100Å | 150μm | 220 |
|  | 1,000Å |  | 200 |
|  | 1,250Å |  | 250 |
| 10 s | 7,100Å | 170μm | 710 |
|  | 8,000Å |  | 800 |
| 15 s | 7,500Å | 180μm | 500 |
|  | 12,000Å |  | 800 |

EXAMPLE III

A workpiece and a solution as are described in Example I are employed. The solution is placed in contact with the surface of the workpiece for 20 minutes to establish a background plating rate for plating without beam activation. The thickness of the resulting plating deposit is less than 100 Å giving rise to a plating rate of less than 0.1 Å/sec.

EXAMPLE IV

The same workpiece geometry, plating solution, and laser configuration are as described in Example I. For this example two workpieces are employed. The nickel film of the first workpiece is contacted with the plating solution and a spot exposed for 10 s, with the resulting spot being 5000 Å thick. The nickel film of the second workpiece is contacted with the plating solution and a spot exposed for 10 s but is left in contact with the solution for an additional 60 s before it is removed. Again the resulting spot thickness is 5000 Å.

Discussion of Examples

Considering first Example III one can calculate an approximate background plating rate. Since less than 100 Å is deposited in 20 minutes the rate of deposition for the background is approximately 0.1 Å per sec. Comparing this background plating rate with the average plating rate for the samples of the Examples I and II, one can appreciate that there is a substantial increase in the plating when it is laser assisted. For these experiments conducted at 25° C. the increase, due to laser enhancement, is of the order of $10^3$ to $10^4$ times that of the background plating rate.

Comparison of Examples I and II illustrates that enhancement in the plating rate occurs when the light beam is used either to illuminate the surface to be plated or conversely to illuminate the side opposite the surface to be plated. In the latter case, the plating will block the beam. Since the beam is blocked by the plating deposit, the beam neither exposes the surface to be plated nor the plating solution. Clearly the mechanism for the enhanced plating rate must be other than light interaction with the plating solution. Furthermore, the mechanism cannot be explained by light sensitization of the surface which would catalyze it and give rise to catalytic deposition from the solution.

Finally, Example IV illustrates that the process cannot be controlled by preferred plating sites that are nucleated by the light during the initial stage of the growth process when the nickel films would be semitransparent. These samples clearly illustrate that the plating ceases on or about the time the beam is stopped. Thus, it should be clear that the mechanism for the enhanced plating rate is not a nucleation controlled mechanism.

Industrial Applicability

The above described method for electroless plating is well suited to applications such as repairing integrated circuits, placing lines on gas display panels and the production of transmission lines on substrates. In view of these applications, the technique should find use in the electronic packaging and related industries.

The technique will also allow one to preferentially plate selected regions locally increasing the thickness where it might be desired to change the mechanical properties i.e. increase wear resistance. This capability of the method should be of general use to the plating industry and of particular interest for the plating of plastic and other dielectric substrates.

While the novel features of this invention have been described in terms of preferred embodiments and for particular industrial applications it will be understood that the various omissions and substitutions in the form and details in the method described may be made by those skilled in the art without departing from the spirit of the invention.

Having thus described our invention, what we claim as new, and desire to secure by Letters Patent is:

1. A method for selectively electrolessly plating of a surface of a workpiece comprising the steps of:
    contacting the surface with a non-photo decomposable electroless plating solution; and
    directing an energy beam onto the workpiece to locally heat the surface to promote enhanced plating.

2. The method of claim 1 wherein said beam is laser generated said beam having an intensity between about $10^2$ W/cm$^2$ and $10^6$ W/cm$^2$.

3. The method of claim 2 wherein said beam is modulated.

4. The method of claim 3 wherein said workpiece is a composite structure having a thermally insulating substrate and a film which is strongly absorbant of the beam's energy.

5. The method of claim 4 wherein said substrate is transparent to the beam which passes through said substrate and impinges on an interface between said substrate and said film.

6. The method of claim 4 wherein said film has a thickness no greater than the minimum dimension of the pattern to be plated.

7. A method for preferentially plating regions of a surface employing a non-photo decomposable electroless plating solution, the improvement comprising:
    directing a light beam onto the region of the surface, to locally heat the surface where preferential plating is sought, said beam having an intensity of at least $10^2$ W/cm$^2$.

* * * * *